(12) United States Patent
Waiblinger et al.

(10) Patent No.: US 7,820,343 B2
(45) Date of Patent: Oct. 26, 2010

(54) METHOD FOR PRODUCING A PHOTOMASK, METHOD FOR PATTERNING A LAYER OR LAYER STACK AND RESIST STACK ON A MASK SUBSTRATE

(75) Inventors: Markus Waiblinger, Dresden (DE); Axel Feicke, Chemnitz (DE); Timo Wandel, Dresden (DE)

(73) Assignee: Advanced Mask Technology Center GmbH & Co. KG (DE)

( * ) Notice: Subject to any disclaimer, the term of this patent is extended or adjusted under 35 U.S.C. 154(b) by 401 days.

(21) Appl. No.: 11/923,798

(22) Filed: Oct. 25, 2007

(65) Prior Publication Data
US 2008/0102382 A1    May 1, 2008

(30) Foreign Application Priority Data
Oct. 25, 2006    (DE) .................... 10 2006 050 363

(51) Int. Cl.
- G03F 1/00    (2006.01)
- G03F 7/20    (2006.01)
- H01L 21/00   (2006.01)
- G03C 5/00    (2006.01)

(52) U.S. Cl. .................... 430/5; 430/296; 430/311; 430/312; 430/394

(58) Field of Classification Search ............ 430/5, 430/311–312, 394, 296
See application file for complete search history.

(56) References Cited

U.S. PATENT DOCUMENTS

| 4,352,870 A | 10/1982 | Howard et al. |
| 6,093,507 A * | 7/2000 | Tzu .......................... 430/5 |

(Continued)

FOREIGN PATENT DOCUMENTS

DE        3044434        8/1981

(Continued)

OTHER PUBLICATIONS

Eric S. Ainley, Scott Ageno, Kevin J. Nordquist, and Douglas J. Resnick, "Sub-100 nm T-gates utilizing a single E-beam lithography exposure process," Jul. 2002, Proc. SPIE 4690, pp. 1150-1156.*

Primary Examiner—S. Rosasco
Assistant Examiner—Jonathan Jelsma
(74) Attorney, Agent, or Firm—Mayback & Hoffman, P.A.; Gregory L. Mayback; Rebecca A. Tie

(57) ABSTRACT

Methods for producing a photomask or layer or stack patterning include applying two resists to a layer, a layer stack, or a mask substrate (collectively "the layer"). Sensitivity of the first resist with respect to the exposure dose is greater than sensitivity of the second. Both resists are subjected to an exposure dose in defined regions of the layer surface, the dose varying locally between first and second doses. The first dose is chosen to expose the first resist but not the second. The second dose is chosen to expose the second resist. After a first development of the second and of the first resist the layer is etched at the uncovered locations for a first time. After complete removal of the second resist and a second development of the first resist, the layer is etched. As a result, it is possible to produce structures of different depths in the layer.

11 Claims, 7 Drawing Sheets

U.S. PATENT DOCUMENTS

| | | |
|---|---|---|
| 6,579,790 B1 * | 6/2003 | Huang et al. ................ 438/637 |
| 2003/0162107 A1 | 8/2003 | Sato |
| 2003/0224255 A1 | 12/2003 | Fujimori |
| 2007/0207391 A1 * | 9/2007 | Lee et al. ...................... 430/5 |

FOREIGN PATENT DOCUMENTS

| | | |
|---|---|---|
| DE | 3027941 | 2/1982 |
| DE | 3133350 | 3/1983 |
| JP | 2002365782 | 12/2002 |
| WO | WO03050619 | 6/2003 |

* cited by examiner

METHOD FOR PRODUCING A PHOTOMASK, METHOD FOR PATTERNING A LAYER OR LAYER STACK AND RESIST STACK ON A MASK SUBSTRATE

CROSS-REFERENCE TO RELATED APPLICATION

This application claims the priority, under 35 U.S.C. §119, of copending German Application No. 10 2006 050 363.5, filed Oct. 25, 2006, which designated the United States and was not published in English; the prior application is herewith incorporated by reference herein in its entirety.

BACKGROUND OF THE INVENTION

Field of the Invention

The invention relates to a method for producing a photomask, a method for patterning a layer stack, a method for patterning a layer, and a resist stack on a mask substrate.

Layers having structures are used in various areas of technology. By way of example, photomasks or micromechanical components have patterned layers or layer stacks. In this case, structures having different depths can be introduced within a layer, or a layer stack can have locally different numbers of patterned layers. Such structures having locally different depths can be produced, for example, in various etching steps. In this case, first, structures having a defined depth are produced in defined lateral regions of the layer or of the layer stack, while other lateral regions of the layer or of the layer stack in which structures having a different depth are intended to be produced are covered with a mask. In a further etching step, structures having different depths are then produced, the etching mask being patterned differently than in the first etching process. For patterning of the etching mask, semiconductor and microsystems technology, for example, utilize in each case a lithographic step in which a resist is exposed and developed and thus patterned. The resist itself can then serve as an etching mask. It is also possible to transfer the structures in the resist into an etching mask.

When a plurality of lithography steps are utilized for the patterning of an etching mask, in particular, the positional accuracy of the various structures with respect to one another is of great importance. Even small deviations of the position of structures produced in a second lithography step with respect to structures produced in a first lithography step can lead to the impairment of the properties of the components during whose production the lithography and etching steps were utilized, or even to the failure of the components.

Furthermore, after the first etching step, a patterned surface of the layer, or of the layer stack, is present, that is to say, the surface has a topography. Such a topography makes it more difficult to perform an accurate lithographic imaging into a resist, which has an adverse effect particularly during the imaging of very small structures.

By way of example, electron beam lithography is employed for producing very small resist structures. When electron beam exposure apparatuses are utilized for producing the resist structures, a plurality of lithography steps lead to a very long overall process time and, thus, to high costs for the fabrication of the component. Furthermore, when an electron beam exposure apparatus is utilized for a second lithography step, charging effects can occur in a layer that has already been patterned.

German Published, Non-Prosecuted Patent Application DE 30 44 434 A1, corresponding to U.S. Pat. No. 4,352,870, describes a method for patterning a resist construction and a resist construction on a substrate, which comprises a lower and an upper resist layer. The upper resist layer has a smaller thickness and a lower sensitivity than the lower resist layer. The lower resist layer has a thickness of at least 100 nm, wherein the thickness is dimensioned such that the number of electrons backscattered to the upper resist layer is very small. This prevents a structural widening in the upper resist layer. In the method, the exposure dose is chosen such that both the upper and the lower resist layers are exposed completely, that is to say to solubility, in each region of the resist construction.

SUMMARY OF THE INVENTION

The invention provides a method for producing a photomask that requires only one exposure step. Furthermore, the invention provides a method in which structures are produced in a layer or in a layer stack with different structure depths, wherein only one exposure step is required. Furthermore, the invention provides a resist stack for carrying out the methods according to the invention.

The methods for producing a photomask and for patterning a layer or a layer stack comprise applying a first resist and applying a second resist to a layer, a layer stack or a mask substrate, wherein the sensitivity of the first resist with respect to the exposure dose is greater than the sensitivity of the second resist with respect to the exposure dose. Both resists are subjected to an exposure dose in an exposure step in defined regions of the layer surface, wherein the exposure dose varies locally between a first and a second exposure dose. In this case, the first exposure dose is chosen such that the first resist is exposed, but the second resist is not exposed. The second exposure dose is chosen such that the second resist is exposed. After a first development of the second and of the first resist the layer, the layer stack or the mask substrate is etched at the uncovered locations for a first time. After the complete removal of the second resist and a second development of the first resist, the layer or the second layer of the layer stack or the second structure layer of the mask substrate is etched. As a result, it is possible to produce structures of different depths in the layer, or it is possible to produce layer stacks or mask substrates which have first structures in the first and the second layer or a structure layer and second structures in the second layer or structure layer. Any of the various embodiments of the herein-described methods (for producing a photo mask or for patterning a layer or a layer stack) can be combined together in any desired combination.

With the foregoing and other objects in view, there is provided, in accordance with the invention, a method for producing a photomask, includes the steps of providing a mask substrate comprising first and second structure layers, the second structure layer disposed above the first structure layer and having a surface defining a substrate surface, applying a first resist material on the substrate surface, the first resist material having a first sensitivity with respect to an exposure dose, applying a second resist material above the first resist material to produce a resist stack, the second resist material having a second sensitivity with respect to the exposure dose, the second sensitivity being lower than the first sensitivity, carrying out an exposure step in which the resist stack is subjected to a locally different exposure dose in defined regions of the substrate surface, the exposure dose varying locally between a first exposure and a second exposure dose and the first exposure dose being less than the second exposure dose, developing the resist stack to uncover the substrate surface only at locations at which the resist stack was subjected to the second exposure dose, etching the first and second structure layers of the mask substrate at the locations where the substrate surface is uncovered, completely removing the second resist material, developing the first resist material, the substrate surface being uncovered at locations at which the resist stack was subjected to the first exposure dose, etching the second structure layer of the mask substrate at locations where the substrate surface is uncovered, and completely removing the first resist material.

With the objects of the invention in view, there is also provided a method for patterning a layer stack, including the steps of providing a layer stack comprising first and second layers, the second layer disposed above the first layer and the surface of the second layer defines a layer stack surface, applying a first resist material on the layer stack surface, the first resist material having a first sensitivity with respect to an exposure dose, applying a second resist material above the first resist material to produce a resist stack, the second resist material having a second sensitivity with respect to the exposure dose, the second sensitivity being lower than the first sensitivity, carrying out an exposure step in which the resist stack is subjected to a locally different exposure dose in defined regions of the layer stack surface, the exposure dose varying locally between a first exposure dose and a second exposure dose, the first exposure dose being less than the second exposure dose, developing the resist stack to uncover the layer stack surface only at locations at which the resist stack was subjected to the second exposure dose, etching the first and the second layers of the layer stack at the locations where the layer stack surface is uncovered, completely removing the second resist material, developing the first resist material, the layer stack surface being uncovered at locations at which the resist stack was subjected to the first exposure dose, etching the second layer of the layer stack at locations where the layer stack surface is uncovered, and completely removing the first resist material.

With the objects of the invention in view, there is also provided a method for patterning a layer, including the steps of providing a layer having a layer surface, applying a first resist material on the layer surface, the first resist material having a first sensitivity with respect to an exposure dose, applying a second resist material above the first resist material to produce a resist stack, the second resist material having a second sensitivity with respect to the exposure dose, the second sensitivity being lower than the first sensitivity, carrying out an exposure step in which the resist stack is subjected to a locally different exposure dose in defined regions of the layer surface, the exposure dose varying locally between a first exposure dose and a second exposure dose, the first exposure dose being less than the second exposure dose, developing the resist stack to uncover the layer surface only at locations at which the resist stack was subjected to the second exposure dose, etching the layer at locations where the layer surface is uncovered, completely removing the second resist material, developing the first resist material, the layer surface being uncovered at locations at which the resist stack was subjected to the first exposure dose, etching the layer at locations where the layer surface is uncovered, and completely removing the first resist material.

With the objects of the invention in view, there is also provided a mask configuration, including a mask substrate having a substrate surface and a resist stack disposed on the mask substrate. The resist stack has a first resist material on the substrate surface and having a first sensitivity with respect to an exposure dose and a second resist material above the first resist material and having a second sensitivity with respect to the exposure dose, the second sensitivity being lower than the first sensitivity.

The method according to the invention for producing a photomask makes it possible, with only one exposure step, for a first and a second structure layer of a mask substrate to be patterned in locally different fashion.

The method according to the invention for patterning a layer stack makes it possible, with only one exposure step, to produce structures, wherein only the second layer of the layer stack is patterned in first regions of the layer stack, and the first and the second layer of the layer stack are patterned in second regions.

The method according to the invention for patterning a layer makes it possible to produce structures having different depths in a layer. In this case, in a first etching step, structures are produced in the regions of the layer surface in which the resist stack was subjected to the second exposure dose. In a second etching step, additional structures are produced in the regions of the layer surface in which the resist stack was subjected to the first exposure dose. The structures already produced in the first etching step are deepened further in the second etching step. The absolute depths of the structures produced are defined by the duration and the parameters of the etching steps, while the ratio of the structure depths to one another is defined by the ratio of the durations and the parameters of the etching steps to one another.

Because the same layer is patterned in both etching steps, it is advantageous to use the same etching process for both etching steps.

The methods according to the invention for producing a photomask and for patterning a layer or a layer stack have a number of advantages over a conventional process utilizing a plurality of exposure steps. Because the structures in both resist materials are produced by one and the same exposure step, problems with regard to the alignment of the different structures with respect to one another are obviated. In other words, there is no need to align structures produced with the aid of a first resist material patterned by a first exposure with respect to structures produced with the aid of a second resist material patterned by a second exposure. This leads to an improvement in the properties of the produced components that comprise the structures produced and to an increase in the yield.

Furthermore, both resist materials are applied on an unpatterned surface. This avoids problems that arise as a result of a lithographic imaging into a resist material situated on a patterned surface. In particular, there is no need to planarize the resist stack surface by a layer having different layer thicknesses. Thus, thin resist materials can also be used, whereby the focusing can be improved and the resolution can thus be increased.

On account of saving an exposure step, the process time for carrying out the methods is shortened and costs are saved.

Because both resist materials are exposed in one exposure step, problems that can occur as a result of utilizing different apparatuses for different exposure steps are obviated. Even when the same exposure apparatus is utilized for different exposure steps, drifting of the apparatus can occur because there is a time interval between the exposure steps, such that the second exposure step can deviate from the first exposure step. This problem, too, is avoided by utilizing only one exposure step.

In particular embodiments of the methods according to the invention, the first and the second resist material are electron beam resists, and the exposure is performed by electron beam lithography. However, it is possible for the methods according to the invention also to be carried out using other exposure methods in which the exposure dose can be varied locally, such as by ion beam lithography, for example. When such exposure apparatuses are utilized for producing the resist structures, the methods according to the invention enable a number of advantages. One advantage lies in the shortening of the overall process time, which is defined, in particular, by the exposure time and, hence, in the reduction of the costs for fabricating the component. Furthermore, an unpatterned layer is situated below the resist stack during the exposure step. If that layer is an electrically conductive layer, it is thus possible to avoid charging effects such as can occur during the electron beam exposure of resists over a layer that has already been patterned.

In one particular embodiment, the first and the second resist material are based on the same basic material. Resist materials generally comprise a layer-forming polymer, a solvent, and, if appropriate, a photoactive compound. Chemically amplified resist materials, furthermore, have catalysts that lead to an amplification of the chemical reaction brought about by the introduction of an exposure dose within the resist material. Such catalysts thus increase the sensitivity of the resist material with respect to the exposure dose. It is thus possible to set the different sensitivities of the first and of the second resist material by way of a different concentration of the catalyst in the basic material.

An intermixing of the first and of the second resist material is intended to be avoided so that the first and the second resist material can be patterned differently by different exposure doses. To achieve this, in one particular embodiment of the methods according to the invention, a first resist material with a first solvent system and a second resist material with a second solvent system are utilized, where the first and second solvent systems do not interact with one another. In one particular embodiment, one solvent system is ketone-based, while the other solvent system is water-based.

A further possibility for avoiding the intermixing of the two resist materials lies in subjecting the first resist material to a thermal step after application and only afterward applying the second resist material. By the thermal step, the solvent is driven out from the first resist material and the resist material is mechanically stabilized.

In one particular embodiment, the intermixing of the first and of the second resist material is avoided by applying an interlayer. In this case, after applying the first resist material and before applying the second resist material, an interlayer is applied to the first resist material. The interlayer is removed after developing the second resist material and before the first development of the first resist material at the uncovered locations. The interlayer is completely removed after the complete removal of the second resist material and before the second development of the first resist material. In this case, the interlayer is constituted to prevent an intermixing of the first and of the second resist material, this does not prevent exposure of the first resist material with the first exposure dose.

In one particular embodiment, the interlayer comprises silicon nitride. Preferably, the thickness of the layer is between 5 nm and 30 nm.

When using an interlayer in accordance with the embodiment described, the second resist material can be completely removed as early as before the first etching step, as soon as the interlayer has been patterned in accordance with the developed second resist material. The interlayer then serves as an etching mask for the first etching step of the methods according to the invention.

The exposure step comprises introducing the substrate to be exposed into the exposure apparatus, orienting the substrate with respect to a reference location within the apparatus, introducing an exposure dose into the resist materials and removing the exposed substrate from the apparatus. In this case, exposure doses of different magnitudes are necessary to expose the first or the second resist material. In this case, "exposure" means the chemical alteration of the resist material such that it becomes soluble for a development solution in the case of a positive resist. Locally different exposure doses, that is to say, the first exposure dose for the exposure of the first resist material and the second exposure dose for the exposure of the second resist material, can be produced differently during the exposure step in this case.

In particular embodiments of the methods according to the invention, the exposure step comprises only a single exposure operation, wherein the locally different exposure doses are produced, for example, by altered shutter times of the electron beam.

However, it is also possible firstly for all the regions of the resist stack in which structures are intended to be produced to be subjected to a first exposure dose, and for only selected regions to be subjected to an additional exposure dose in a second exposure operation, wherein the additional exposure dose is greater than or equal to the difference between the second and the first exposure dose.

The resist stack according to the invention on a mask substrate comprises a first resist material on the surface of the mask substrate and a second resist material disposed above the first resist material. The first resist material has a first sensitivity with respect to the exposure dose, and the second resist material has a second sensitivity with respect to the exposure dose, the second sensitivity being lower than the first sensitivity. In this case, the sensitivities of the resist materials and the thicknesses of the resist materials are set such that the first resist material can be exposed with a first exposure dose at which the second resist is not exposed. In this case, the resist layer thicknesses are of the order of magnitude of 100 nm to 450 nm. The layer thickness is substantially determined by the patterning process, that is to say, the etching process. By way of example, the resist layer thickness when etching chromium must be greater than the resist removal during the chromium etching process. It cannot be ruled out that patterning processes permitting significantly thinner layer thicknesses will be possible in the future. The ratio of the layer thicknesses is typically determined by the materials used in the layers to be patterned and, thus, by the patterning processes used. When using an MoSi layer as first structure layer of the mask substrate and a chromium layer as second structure layer of the mask substrate, the first resist material can have a thickness of 200 nm, while the second resist material can have a thickness of approximately 420 nm.

The resist stack according to the invention makes it possible to carry out the methods for producing a photomask and for patterning a layer or a layer stack according to the present information.

Other features that are considered as characteristic for the invention are set forth in the appended claims.

Although the invention is illustrated and described herein as embodied in a method for producing a photomask, a method for patterning a layer stack, a method for patterning a layer, and a resist stack on a mask substrate, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following descrip-

DESCRIPTION OF THE PREFERRED EMBODIMENT

In the figures, identical or mutually corresponding regions, components/component groups are identified by the same reference symbols.

Figure 1A:
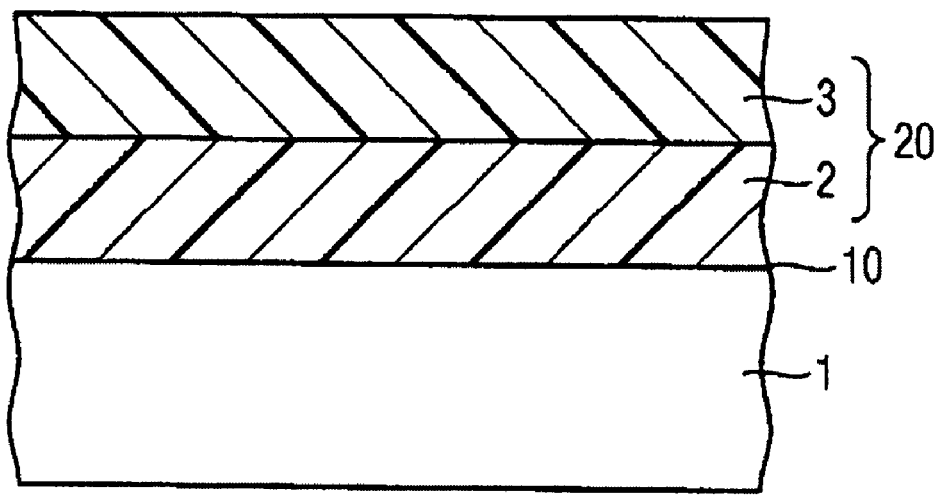
FIG. 1A is a fragmentary, cross-sectional view of a first embodiment of the resist stack according to the invention.

Referring now to the figures of the drawings in detail and first, particularly to FIG. 1A thereof, there is shown a first embodiment of the resist stack 20 according to the invention. The resist stack 20 comprises a first resist material 2 and a second resist material 3. The first resist material 2 having a first sensitivity with respect to the exposure dose is disposed on a substrate 1 having a substrate surface 10. The second resist material 3 having a second sensitivity with respect to the exposure dose is disposed on the first resist material 2, wherein the second sensitivity is lower than the first sensitivity. In this case, "sensitivity" means the ability of a resist material to be completely exposed at a defined exposure dose. In other words, the more sensitive a resist material is, the lower the exposure dose required for complete exposure. By way of example, the required exposure dose of the first resist material 2 is 5 $\mu C/cm^2$, while the required exposure dose of the second resist material 3 is 10 $\mu C/cm^2$, for example. The two resist materials 2, 3 are not necessarily associated with the same resist type. In other words, the first resist 2 and the second resist 3 can both be positive resists, or the first resist 2 and the second resists 3 can both be negative resists, or the first resist 2 and the second resist 3 can be of a different resist type.

The first resist material 2 and the second resist material 3 can be electron beam resists. However, other resists that are suitable, for example, for an ion beam exposure can also be utilized as first resist material 2 and second resist material 3.

To prevent an intermixing of the first resist material 2 and of the second resist material 3, the first resist material 2 and the second resist material 3 can in each case have solvent systems that do not interact with one another. In this case, the solvent system of one resist material 2 or 3 can be ketone-based, while the solvent system of the other resist material 2 or 3 is water-based.

Figure 1B:
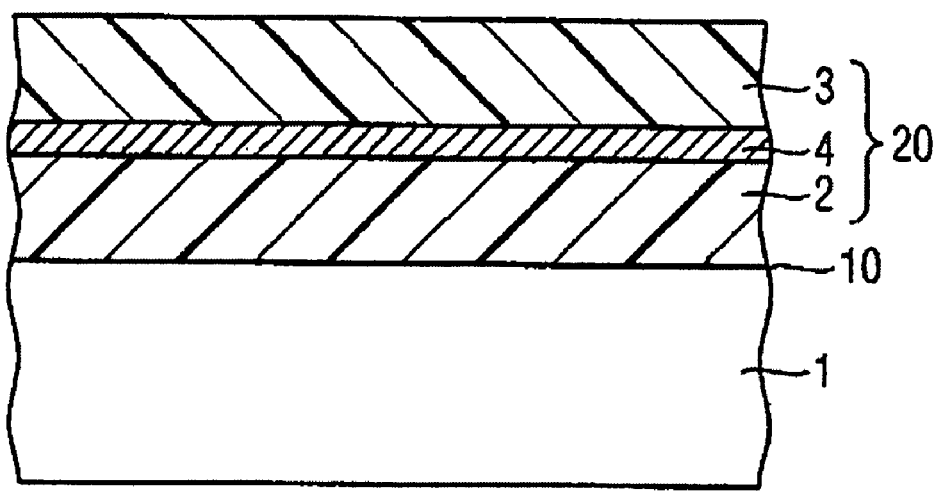
FIG. 1B is a fragmentary, cross-sectional view of a second embodiment as the resist stack according to the invention.

FIG. 1B shows a second embodiment of the resist stack 20 according to the invention. The resist stack 20 comprises a first resist material 2, an interlayer 4, and a second resist material 3. In this case, the first resist material 2 is disposed on a substrate 1 having a substrate surface 10. The interlayer 4 is disposed on the surface of the first resist material 2, the second resist material 3 being disposed on the surface of the interlayer. Both resist materials 2 and 3 are, once again, associated with the same resist type, as described with reference to FIG. 1A. The interlayer 4 is configured so that it prevents an intermixing of the resist materials 2 and 3. On the other hand, the interlayer 4 is configured so that it does not prevent an exposure of the first resist material 2 with a first exposure dose, wherein the first exposure dose is so low that the second resist material 3 is not exposed.

In an exemplary embodiment, the interlayer 4 comprises silicon nitride. The interlayer 4, in an exemplary embodiment, has a thickness of 5 nm to 30 nm, for example, of 5 nm to 20 nm.

Figure 2A:
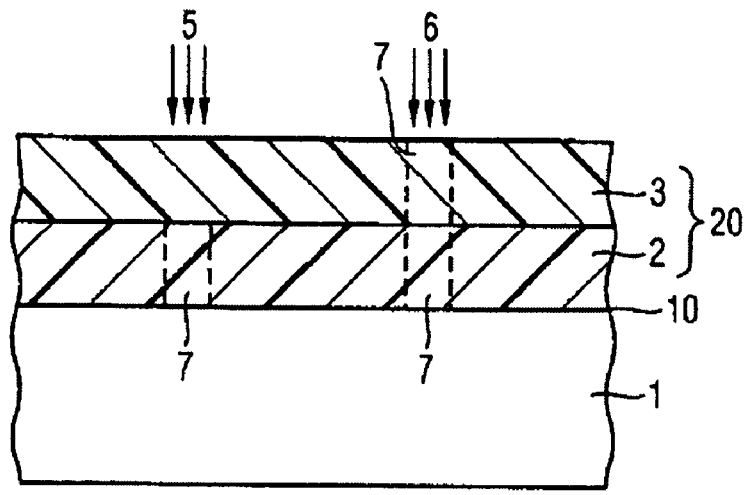
FIG. 2A is a fragmentary, cross-sectional view of a component in a first process step of a first embodiment of the method according to the invention for patterning a layer.

A first embodiment of the method according to the invention for patterning a layer is explained with reference to FIGS. 2A to 2F. FIG. 2A shows a component in a first process step of the method according to the invention. A first resist material 2 is applied on a layer 1 having a layer surface 10. The layer 1 can be a substrate or any desired layer on a substrate; in particular, the layer 1 can also be an electrically non-conductive or semiconducting layer or substrate. However, measures that prevent charging of the layer 1 during the electron beam exposure are, then, necessarily appropriate. The first resist material 2 has a first sensitivity with respect to the exposure dose. A second resist material 3 is applied above the first resist material 2, the second resist material 3 having a second sensitivity with respect to the exposure dose, wherein the second sensitivity is lower than the first sensitivity. Both resist materials 2, 3 are positive resists in the embodiment illustrated here.

Figure 3A:
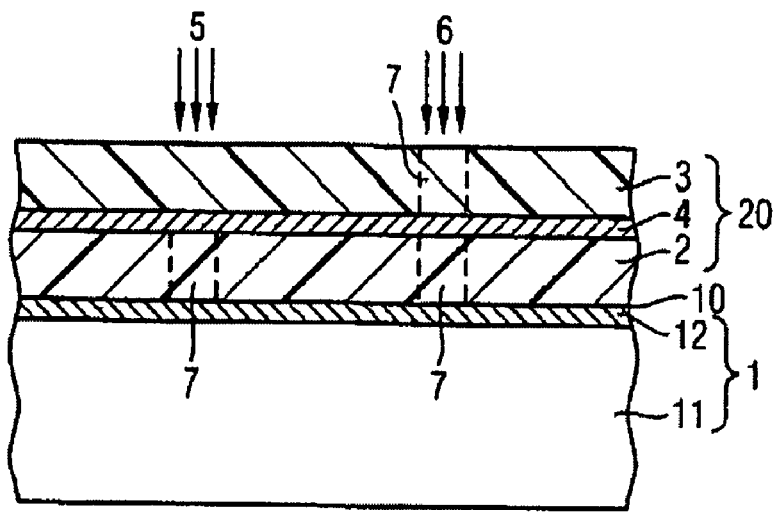
FIG. 3A is a fragmentary, cross-sectional view of a component in a first process step of a first embodiment of the method according to the invention for patterning a layer stack.

It is possible to apply an interlayer between the first resist material 2 and the second resist material 3, as will be explained in more detail with reference to FIG. 3A. This results in some additional process steps as are explained with reference to FIGS. 3A to 3H.

The resist stack 20 comprising the first resist material 2 and the second resist material 3 is subjected to a locally different exposure dose in defined regions of the layer surface 10 wherein the exposure dose varies between a first exposure dose 5 and a second exposure dose 6. In this case, the first exposure dose 5 is large enough to expose the first resist material 2, but less than an exposure dose necessary for exposing the second resist material 3. The second exposure dose 6 is large enough to expose the second resist material 3. The exposure produces exposed locations 7 in the resist materials 2 and 3. In this case, in the regions that were exposed with the first exposure dose 5, exposed locations 7 are produced only in the first resist material 2, while in regions that were exposed with the second exposure dose 6, exposed locations 7 are produced in the first resist material 2 and in the second resist material 3. The structure with the exposed locations 7 in the resist materials 2 and 3 that is present after the exposure is illustrated in FIG. 2A.

Figure 2B:
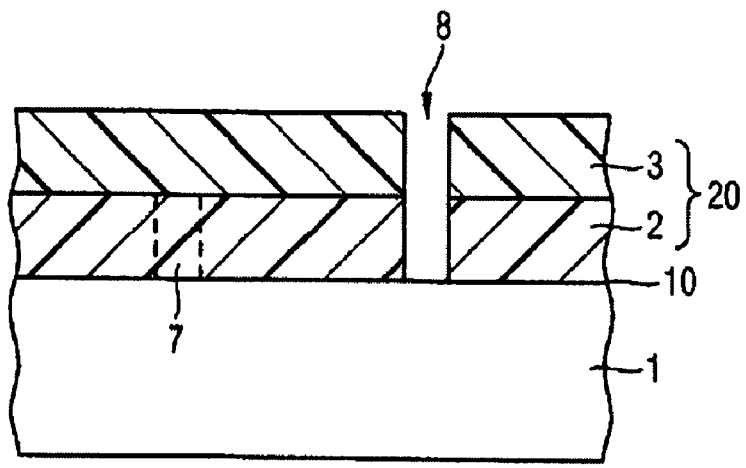
FIG. 2B is a fragmentary, cross-sectional view of component in a second process step of the first embodiment of the method according to the invention for patterning a layer.

Afterwards, first of all, the resist material 3 is developed, wherein the exposed locations 7 are removed. The resist material 2 is, subsequently developed, wherein only those exposed locations 7 in the resist material 2 that are freely accessible through the already removed resist material 3 are removed. In other words, the resist materials 2 and 3 are developed and removed at the locations at which they were subjected to the second exposure dose 6. The exposed locations 7 in the resist material 2 that were produced by the action of the first exposure dose 5 are not developed in this case because the exposure dose at those locations was not high enough to expose the resist material 3. After the development of the resist stack 20, openings 8 are formed in the resist stack 20 that extend from the surface of the second resist material 3 as far as the surface 10 of the substrate 1. The resultant structure is illustrated in FIG. 2B. In this case, the surface 10 of the layer 1 is only uncovered at the locations at which the resist materials 2 and 3 were subjected to the second exposure dose 6.

Figure 2C:
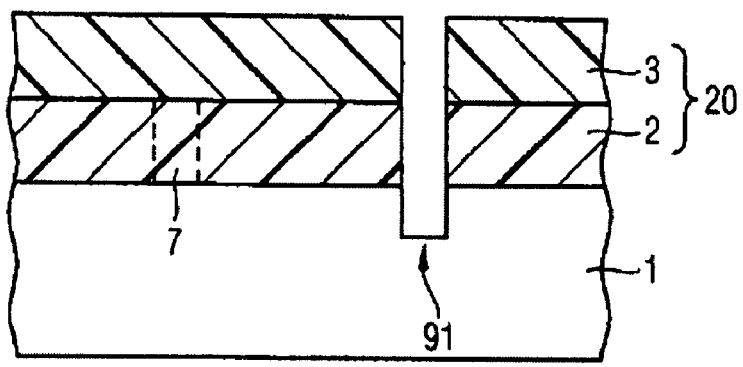
FIG. 2C is a fragmentary, cross-sectional view of a component in a third process step of the first embodiment of the method according to the invention for patterning a layer.

The layer 1 is etched subsequently at the locations at which the surface 10 of the layer 1 is uncovered, wherein first structures 91 are formed in the layer 1. In this case, the resist materials 2 and 3 act as an etching mask for the etching process. The resultant structure is illustrated in FIG. 2C.

Figure 2D:
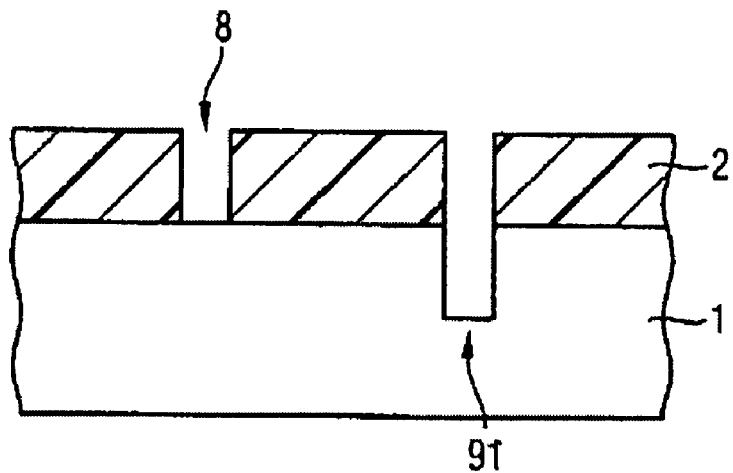
FIG. 2D is a fragmentary, cross-sectional view of a component in a fourth process step of the first embodiment of the method according to the invention for patterning a layer.

Afterward, the second resist material 3 is completely removed so that only the resist material 2 is situated on the surface 10 of the layer 1. The first resist material 2 is developed for a second time, wherein the exposed locations 7 that were produced with the first exposure dose 5 are removed because they are no longer covered by the resist material 3 unexposed at those locations. Second openings 8 are, thereby, formed in the resist material 2. The resultant structure is illustrated in FIG. 2D.

In a second etching step, the layer 1 is etched at the locations at which the surface 10 of the layer 1 is uncovered. As a result, the first structures 91 are deepened further in the layer 1, while second structures 92 are produced in the layer 1 at the now uncovered locations of the surface 10. After the end of the etching operation, structures 91, 92, having different structure depths are situated in the layer 1. The structures 91 have a depth d91 measured from the surface 10 of the layer 1, while the structures 92 have a depth d92 measured from the surface 10 of the layer 1. In this case, d92 is less than d91. The absolute values of the depths d91 and d92 result from the process parameters and the durations of the first and of the second etching step. The ratio of the depth d91 to d92 can be set by way of the process parameters and the durations of the individual etching steps. In particular, the same process parameters can be utilized for both etching steps because the same layer 1 is patterned. The lateral dimensions of the openings 8 in the resist stack 20 and the lateral dimensions and the depth of the structures 91 already partly formed in the layer 1 are likewise a parameter for the etching depths d91 and d92 to be achieved. The resulting structure is illustrated in FIG. 2E.

Figure 2E:
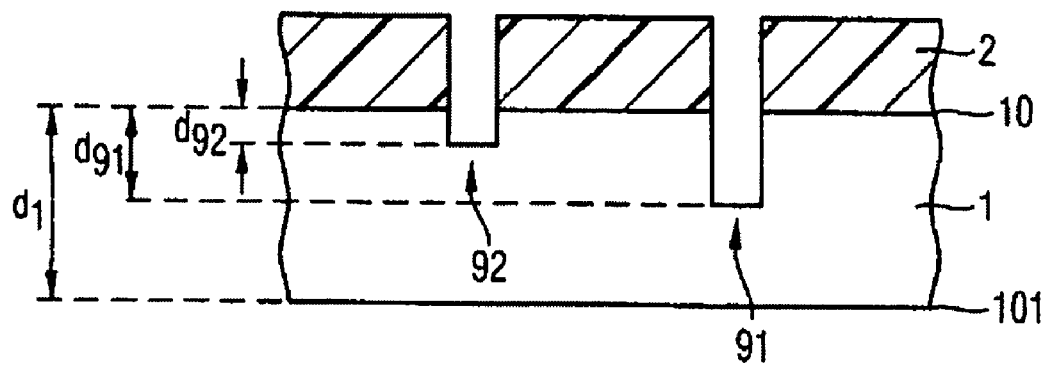
FIG. 2E is a fragmentary, cross-sectional view of a component in a fifth process step of the first embodiment of the method according to the invention for patterning a layer.

In the embodiment illustrated in FIG. 2E, the depths d91 and d92 are smaller than the thickness d1 of the layer 1. However, it is also possible for the structures 91 to extend as far as the rear side 101 of the layer 1. In other words: the depth d91 can be greater than or equal to the thickness d1 of the layer 1. A further layer disposed below the layer 1, for example, could, then, act as an etching step or alter the etching operation so that the ratio of the depths d91 to d92 is no longer dependent solely on the parameters and the durations of the etching steps.

Figure 2F:
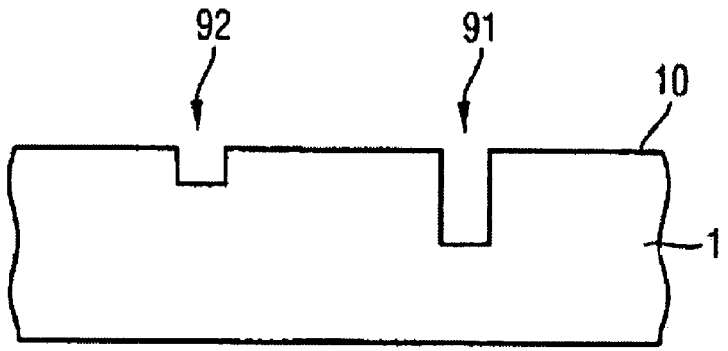
FIG. 2F is a fragmentary, cross-sectional view of a component in a sixth process step of the first embodiment of the method according to the invention for patterning a layer.

Afterward, the first resist material 2 is completely removed from the surface 10 of the layer 1. The layer 1, thus, comprises first structures 91 and second structures 92 having different structure depths d91 and d92, as illustrated in FIG. 2F.

The method according to the invention for patterning a layer stack is explained with reference to FIGS. 3A to 3H. The method according to the invention for producing a photomask differs from the method according to the invention for patterning a layer stack through the choice of the individual layers, which is discussed in the explanation of the individual figures. The method explained with reference to FIGS. 3A to 3H can, however, also be performed without the interlayer 4 illustrated here, in which case the method steps concerning the interlayer 4 are, then, omitted.

First, a layer stack 1 is provided, which comprises a first layer 11 and a second layer 12 disposed above the first layer 11. In this case, the surface of the second layer 12 defines a layer stack surface 10. By way of example, a mask substrate of a photomask can comprise such a layer stack 1. In this case, the first layer 11 is a first structure layer and the second layer 12 is a second structure layer. The first structure layer 11 can be a phase-shifting layer, for example, while the second structure layer 12 can be an opaque layer, for example. The first structure layer 11 can comprise, for example, MoSiON or a glass (for example, $SiO_2$). The second structure layer 12 can comprise chromium, for example. Furthermore, the mask substrate of a photomask can comprise further layers, but these are not illustrated here.

A first resist material 2 is applied on the layer stack surface 10, the first resist material 2 having a first sensitivity with respect to the exposure dose. An interlayer 4 is applied on the first resist material 2. A second resist material 3 is applied on the interlayer 4, the second resist material 3 having a second sensitivity with respect to the exposure dose, which is lower than the first sensitivity of the first resist material 2. The interlayer comprises a silicon nitride, for example, but other materials such as, for example, MoSi or polymers are also conceivable. In this case, the interlayer 4 may have the following properties, first, it prevents an intermixing of the first resist material 2 and of the second resist material 3. Secondly, it does not prevent the exposure of the first resist material 2 by the exposure method chosen. In particular, the exposure dose required for exposing the first resist material 2 below the interlayer 4 is less than the exposure dose required for exposing the second resist material 3. Furthermore, the interlayer 4 is intended to prevent an influencing of the resist material 2, so-called cross-linking, in steps that are to be carried out later, such as, for example, the development of the resist material 3 and also the first etching step for producing first structures.

The applied resist materials 2 and 3 are subjected subsequently to a locally different exposure dose in defined regions of the layer stack surface 10, wherein the exposure dose varies between a first exposure dose 5 and a second exposure dose 6. In this case, the first exposure dose 5 is chosen so that the first resist material 2 is exposed but the second resist material 3 is not exposed. The second exposure dose 6 is chosen so that the second resist material 3 and, thus, also the first resist material 2, is exposed. As a result of the exposure, exposed locations 7 are formed in the resist stack 20. In this case, the exposed locations 7 in the regions in which the resist stack 20 was subjected to the first exposure dose 5 are situated only in the first resist material 2, while the exposed locations 7 in the regions in which the resist stack 20 was subjected to the second exposure dose 6 are situated in the resist materials 2 and 3. The structure present after the exposure is illustrated in FIG. 3A.

Figure 3B:
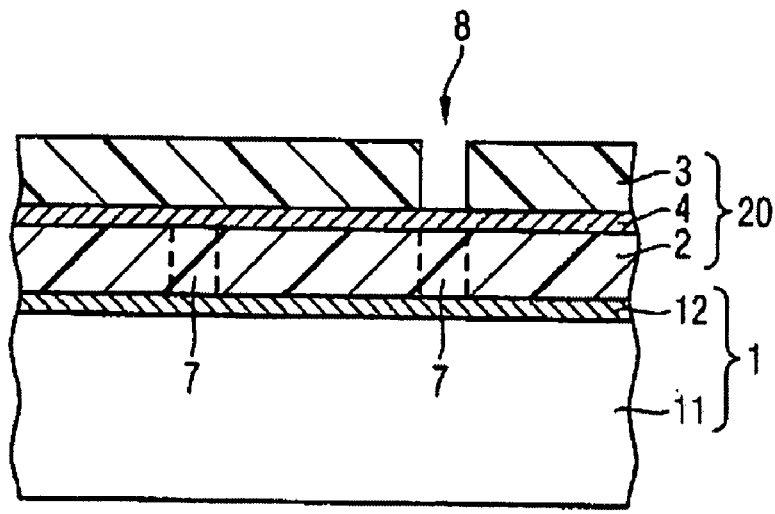
FIG. 3B is a fragmentary, cross-sectional view of a component in a second process step of the first embodiment of the method according to the invention for patterning a layer stack.

After the exposure step, first, the second resist material 3 is developed, wherein openings 8 are formed in the resist material 3 in the regions in which the resist stack 20 was exposed with the second exposure dose 6. The resist material 2 is completely covered by the interlayer 4 so that the first resist material 2 is not developed. Thus, in the openings 8 in the resist material 3, the interlayer 4 is uncovered at the locations at which the resist stack was exposed with the second exposure dose 6. The resultant structure is illustrated in FIG. 3B.

Figure 3C:
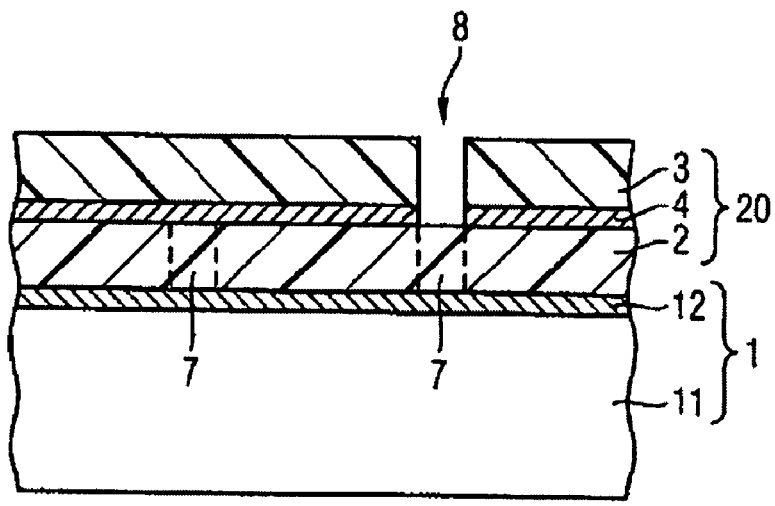
FIG. 3C is a fragmentary, cross-sectional view of a component in a third process step of the first embodiment of the method according to the invention for patterning a layer stack.

Afterward, the interlayer 4 is removed in the openings 8 in the resist material 3 so that, as a result, the surface of the first resist material 2 is uncovered at the locations at which the resist stack was exposed with the second exposure dose 6. The resultant structure is illustrated in FIG. 3C.

Figure 3D:
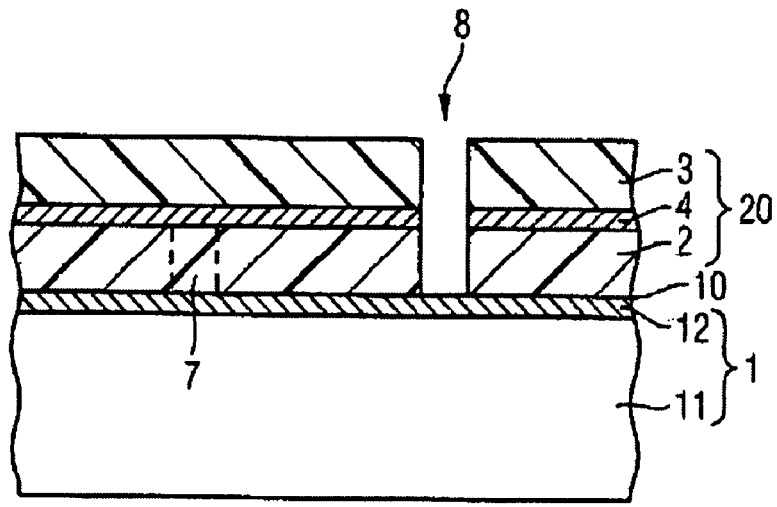
FIG. 3D is a fragmentary, cross-sectional view of a component in a fourth process step of the first embodiment of the method according to the invention for patterning a layer stack.

Afterward, the first resist material 2 is developed, wherein only those exposed locations 7 in the resist material 2 that are freely accessible are removed. In other words, the exposed locations 7 in the resist material 2 are removed only in the regions in which the resist stack 20 was subjected to the second exposure dose 6. After the development of the first resist material 2, openings 8 are situated in the resist materials 2 and 3 and also the interlayer 4 in the regions in which the resist stack 20 was exposed with the second exposure dose 6. The surface 10 of the layer stack 1 is uncovered at these locations, that is to say, within the openings 8. The resultant structure is illustrated in FIG. 3D.

Figure 3E:
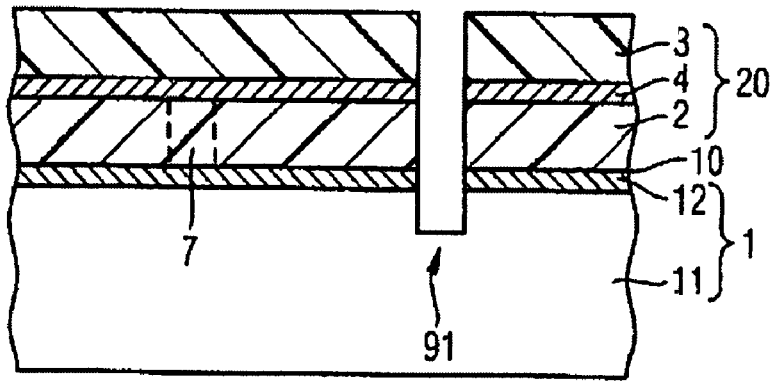
FIG. 3E is a fragmentary, cross-sectional view of a component in a fifth process step of the first embodiment of the method according to the invention for patterning a layer stack.

In a first etching step, first structures 91 are produced in the layer stack 1 at the locations at which the resist stack 20 was exposed with the second exposure dose 6. During the first etching step, in this case the second layer 12 is completely removed in these regions, while the first layer 11 is etched down to a first depth. In this first etching step, it is possible to use different etching processes for removing the second layer 12 and for etching the first layer 11. In this case, the first depth of the structures 91 present after the first etching step is defined by the etching parameters and the duration of the first etching step. The resultant structure is illustrated in FIG. 3E.

Figure 3F:
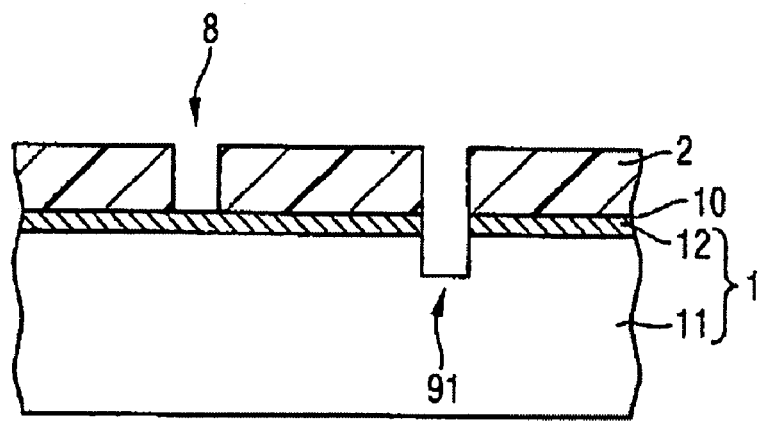
FIG. 3F is a fragmentary, cross-sectional view of a component in a sixth process step of the first embodiment of the method according to the invention for patterning a layer stack.

Afterward, the second resist material 3 and the interlayer 4 are completely removed so that the surface of the first resist material 2 is uncovered. The second resist material 3 can be completely removed as early as after removing the interlayer 4 in the openings 8 uncovered in the first development step. However, it is also possible to remove the second resist material 3 after the first development of the resist stack 20 and before the etching of the layer stack 1. In other words: the second resist material 3 can be removed as early as after the process step illustrated in FIG. 3C or in FIG. 3D. After the complete removal of the interlayer 4, the first resist material 2 is developed for a second time, wherein those exposed locations 7 in the regions in which the resist stack 20 was subjected to the first exposure dose 5 are removed. This gives rise to further openings 8 in the resist material 2, in which openings the surface 10 of the layer stack 1 is uncovered. In other words, after the second development of the first resist material 2, the surface of the first structures 91 in the layer stack 1 and the surface 10 of the layer stack 1 are uncovered at the locations at which the resist material 2 was exposed. The resultant structure is illustrated in FIG. 3F.

Figure 3G:
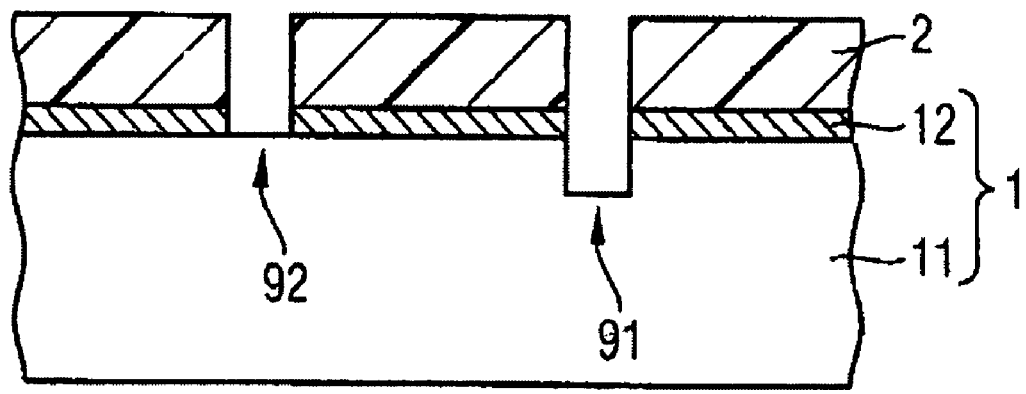
FIG. 3G is a fragmentary, cross-sectional view of a component in a seventh process step of the first embodiment of the method according to the invention for patterning a layer stack.

In a second etching step, the second layer 12 of the layer stack 1 is then etched, wherein second structures 92 are produced in the layer stack 1. Depending on the selectivity of this etching step with respect to the first layer 11, the structures 91 are etched further, if appropriate, so that their structure depth can increase. For the case where the second structures 92 are intended to be situated only in the second layer 12, here, a high selectivity of the etching process with respect to the first layer 11 is desired. The resultant structure is illustrated in FIG. 3G.

Figure 3H:
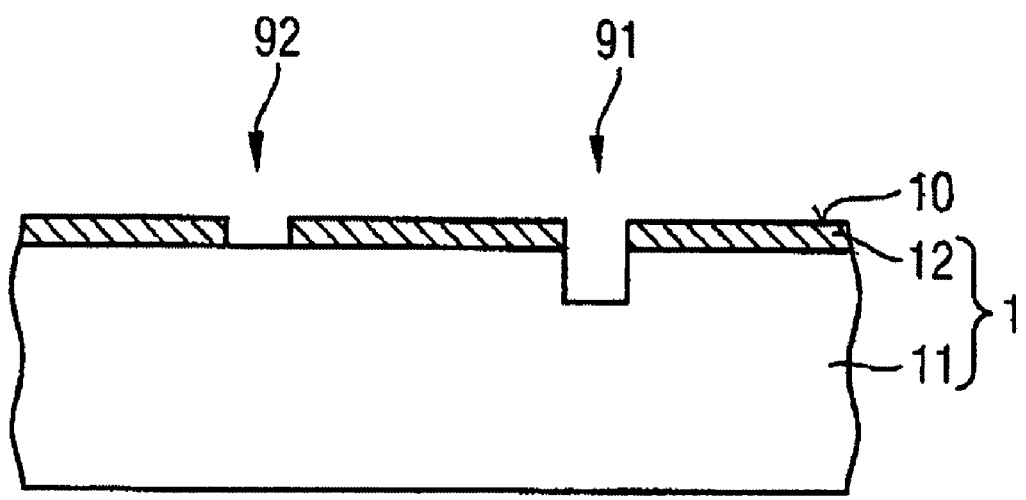
FIG. 3H is a fragmentary, cross-sectional view of a component in an eighth process step of the first embodiment of the method according to the invention for patterning a layer stack.

Afterward, the first resist material 2 is completely removed from the surface 10 of the layer stack 1. The resultant structure, which is illustrated in FIG. 3H, has first structures 91 and second structures 92. In this case, the first structures 91 extend from the surface 10 of the layer stack 1 right into the first layer 11, while the second structures 92 are situated only in the second layer 12 of the layer stack 1.

One advantage of the method illustrated with reference to FIGS. 2A to 2F is the possibility of producing structures of different depths in the layer 1 by only one exposure step. As a result, process time and costs can be reduced, and problems with regard to the alignment accuracy that occur when two exposure steps are utilized can be avoided.

A further advantage is the avoidance of topography problems during the exposure. Usually, two exposure steps separated from one another by an etching step are utilized for producing structures of different depths in a layer or in a layer stack 1, wherein a patterned layer or a patterned layer stack 1 is already present below a resist material in the second exposure step. Problems can, thereby, occur during the lithographic imaging of structures in the resist material. These problems are avoided in the case of the method according to the invention because the exposure is only effected once and the layer or the layer stack 1 is present in this case in unpatterned fashion below the resist materials 2 and 3.

These advantages are likewise afforded when carrying out the method explained with reference to FIGS. 3A to 3H. For the case where the first layer 11 is an electrically non-conductive layer and the second layer 12 is an electrically conductive layer, a further advantage of the methods according to the invention is afforded over conventional methods utilizing two exposure steps separated from one another by an etching step of the second layer 12 because charging of the layer stack 1 during the exposure step (for example, by electron beam exposure) is avoided.

Locally different exposure doses can be produced in various ways during the exposure step. One possibility lies, when utilizing electron beam exposure apparatuses, for example, in the locally different time duration of the impingement of the electron beam on the surface of the resist stack 20.

Figure 4:
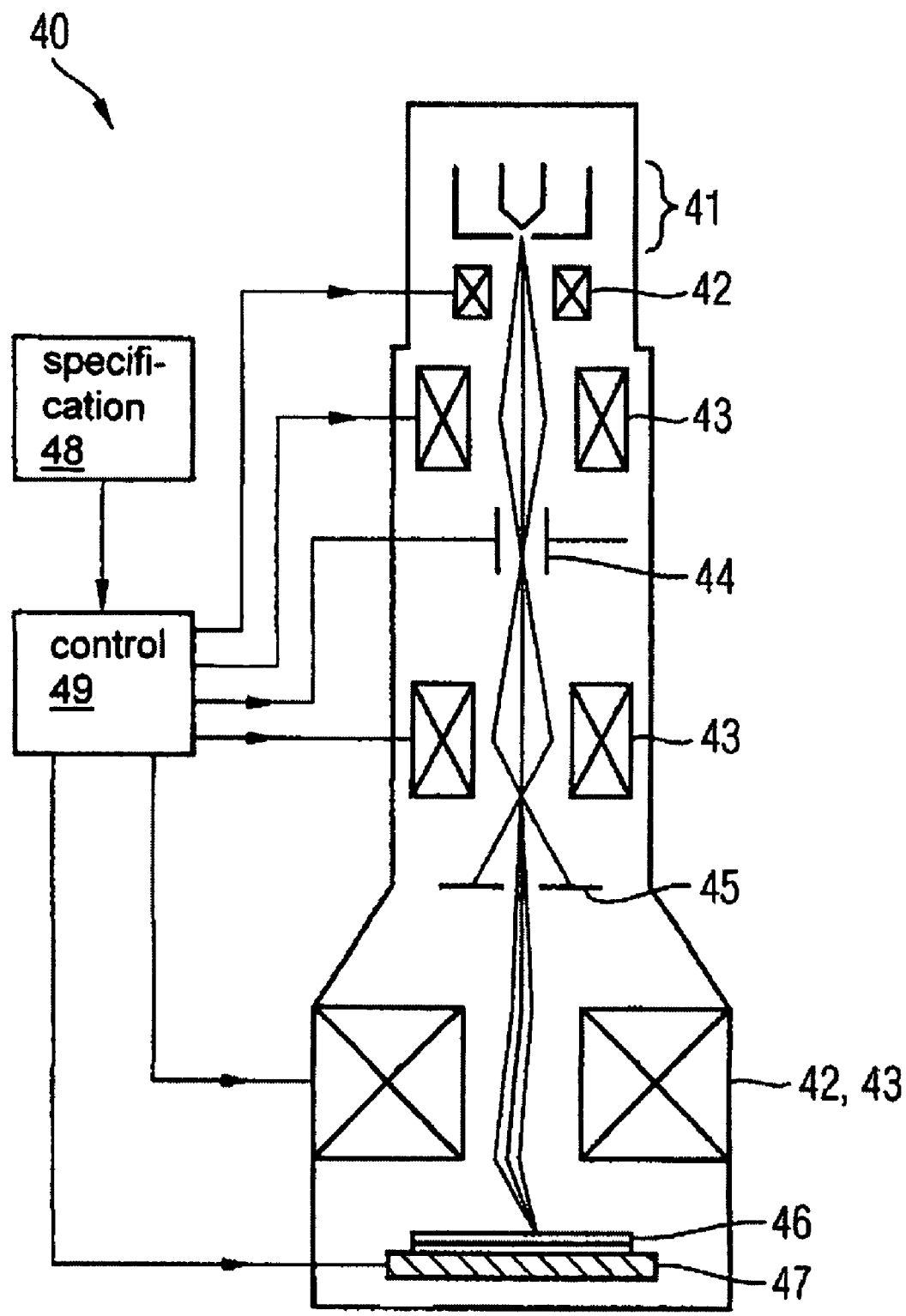
FIG. 4 is a block circuit diagram of an electron beam exposure apparatus.

FIG. 4 schematically illustrates the construction of an electron beam exposure apparatus 40. The electron beam generated in an electron source 41 is focused and oriented with the aid of deflection coils 42, condenser lenses 43, and the aperture 45 so that it produces desired structures on a resist-coated substrate 46 situated on a controllable mechanical mount 47. In this case, the electron beam can be masked out with the aid of an electric field at the capacitor plates 44 so that it does not impinge on the substrate 46. In this case, a control electronic unit 49 controls the deflection coils 42, condenser lenses 43, capacitor plates 44, and the mechanical mount 49 so that structures are produced in accordance with a structure specification 48 in the resist-coated substrate 46. Locally different exposure doses can be produced, for example, by a different temporal control of the capacitor plates 44 for masking out the beam. In other words, the resist-coated substrate 46 is subjected to the electron beam for different lengths of time in different regions of its surface because the electron beam is introduced or masked out for different lengths of time.

The methods for patterning a layer stack as explained with reference to FIGS. 3A to 3H can be used in particular for producing photomasks, but is not limited thereto. In particular, photomechanical systems, such as micromechanical switches, for example, or other components whose production necessitates a high alignment accuracy of very small structures with respect to one another can be produced advantageously by the methods according to the invention for patterning a layer or a layer stack.

What is claimed is:

1. A method for producing a photomask, which comprises:
   providing a mask substrate comprising first and second structure layers, the second structure layer disposed above the first structure layer and having a surface defining a substrate surface;
   applying a first resist material on the substrate surface, the first resist material having a first sensitivity with respect to an exposure dose;
   applying a second resist material above the first resist material to produce a resist stack, the second resist material having a second sensitivity with respect to the exposure dose, the second sensitivity being lower than the first sensitivity;
   carrying out an exposure step in which the resist stack is subjected to a locally different exposure dose in defined regions of the substrate surface, the exposure dose varying locally between a first exposure and a second exposure dose and the first exposure dose being less than the second exposure dose;
   developing the resist stack to uncover the substrate surface only at locations at which the resist stack was subjected to the second exposure dose;
   etching the first and second structure layers of the mask substrate at the locations where the substrate surface is uncovered using the resist stack as an etching mask;
   completely removing the second resist material after etching the first and the second structure layers;
   developing the first resist material after removing the second resist material, the substrate surface being uncovered at locations at which the resist stack was subjected to the first exposure dose;
   etching the second structure layer of the mask substrate at locations where the substrate surface is uncovered using the first resist material as an etching mask; and
   completely removing the first resist material after etching the second structure layer.

2. The method according to claim 1, wherein the first and second resist materials are electron beam resist materials and the exposure step is carried out by electron beam lithography.

3. The method according to claim 1, wherein the first and second resist materials are based on the same basic material but differ in terms of a concentration of a catalyst.

4. The method according to claim 1, which further comprises carrying out the exposure step of the resist stack in only a single exposure operation with locally different exposure doses.

5. The method according to claim 1, wherein solvent systems of the first and second resist materials do not interact with one another.

6. The method according to claim 5, wherein one of the solvent systems is ketone-based and the other solvent system is water-based.

7. The method according to claim 1, which further comprises:
   applying an interlayer between the steps of applying the first and second resist materials;
   removing the interlayer between developing the second resist material and the first developing of the first resist material at the uncovered locations; and
   completely removing the interlayer after completely removing the second resist material and before the second developing of the first resist material.

8. The method according to claim 7, wherein the interlayer comprises silicon nitride.

9. The method according to claim 1, which further comprises performing a thermal step between applying the first and second resist materials.

10. A method for patterning a layer stack, which comprises:
    providing a layer stack comprising first and second layers, the second layer disposed above the first layer and the surface of the second layer defines a layer stack surface;
    applying a first resist material on the layer stack surface, the first resist material having a first sensitivity with respect to an exposure dose;
    applying a second resist material above the first resist material to produce a resist stack, the second resist material having a second sensitivity with respect to the exposure dose, the second sensitivity being lower than the first sensitivity;
    carrying out an exposure step in which the resist stack is subjected to a locally different exposure dose in defined regions of the layer stack surface, the exposure dose varying locally between a first exposure dose and a second exposure dose, the first exposure dose being less than the second exposure dose;
    developing the resist stack to uncover the layer stack surface only at locations at which the resist stack was subjected to the second exposure dose;
    etching the first and the second layers of the layer stack at the locations where the layer stack surface is uncovered using the resist stack as an etching mask;
    completely removing the second resist material after etching the first and the second layers of the layer stack;

developing the first resist material after removing the second resist material, the layer stack surface being uncovered at locations at which the resist stack was subjected to the first exposure dose;
etching the second layer of the layer stack at locations where the layer stack surface is uncovered using the first resist material as an etching mask; and
completely removing the first resist material after etching the second layer of the layer stack.

11. A method for patterning a layer, which comprises:
providing a layer having a layer surface;
applying a first resist material on the layer surface, the first resist material having a first sensitivity with respect to an exposure dose;
applying a second resist material above the first resist material to produce a resist stack, the second resist material having a second sensitivity with respect to the exposure dose, the second sensitivity being lower than the first sensitivity;
carrying out an exposure step in which the resist stack is subjected to a locally different exposure dose in defined regions of the layer surface, the exposure dose varying locally between a first exposure dose and a second exposure dose, the first exposure dose being less than the second exposure dose;
developing the resist stack to uncover the layer surface only at locations at which the resist stack was subjected to the second exposure dose;
etching the layer at locations where the layer surface is uncovered using the resist stack as an etching mask;
completely removing the second resist material after etching the layer;
developing the first resist material after removing the second resist material, the layer surface being uncovered at locations at which the resist stack was subjected to the first exposure dose;
etching the layer at locations where the layer surface is uncovered using the first resist material as an etching mask; and
completely removing the first resist material after etching the layer using the first resist material as an etching mask.

* * * * *